(12) United States Patent
Blum et al.

(10) Patent No.: US 8,476,119 B2
(45) Date of Patent: *Jul. 2, 2013

(54) ENCAPSULATION METHODS AND DIELECTRIC LAYERS FOR ORGANIC ELECTRICAL DEVICES

(75) Inventors: Yigal D. Blum, San Jose, CA (US); William Siu-Keung Chu, Newark, CA (US); David Brent MacQueen, Foster City, CA (US); Yijian Shi, Mountain View, CA (US)

(73) Assignee: SRI International, Menlo Park, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/202,065

(22) PCT Filed: Mar. 4, 2009

(86) PCT No.: PCT/US2009/001397
§ 371 (c)(1),
(2), (4) Date: Oct. 28, 2011

(87) PCT Pub. No.: WO2010/101543
PCT Pub. Date: Sep. 10, 2010

(65) Prior Publication Data
US 2012/0038066 A1    Feb. 16, 2012

(51) Int. Cl.
*H01L 21/44*    (2006.01)

(52) U.S. Cl.
USPC ............................................. 438/127

(58) Field of Classification Search
USPC .. 438/124–127, 117, 112, 108; 257/E21.507, 257/E23.117
See application file for complete search history.

(56) References Cited

U.S. PATENT DOCUMENTS
2004/0238846 A1* 12/2004 Wittmann et al. ............ 257/200

* cited by examiner

*Primary Examiner* — Hoa B Trinh
(74) *Attorney, Agent, or Firm* — Richard Aron Osman; Isaac Rutenberg

(57) ABSTRACT

The disclosure provides methods and materials suitable for use as encapsulation barriers and dielectric layers in electronic devices. In one embodiment, for example, there is provided an electroluminescent device or other electronic device with a dielectric layer comprising alternating layers of a silicon-containing bonding material and a ceramic material. The methods provide, for example, electronic devices with increased stability and shelf-life. The invention is useful, for example, in the field of microelectronic devices.

23 Claims, 4 Drawing Sheets

ENCAPSULATION METHODS AND DIELECTRIC LAYERS FOR ORGANIC ELECTRICAL DEVICES

ACKNOWLEDGEMENT OF GOVERNMENT SUPPORT

This invention was made with Government support under a grant from the U.S. Department of Energy, grant no. DE-FC26-06NT42936. The Government has certain rights in the invention.

TECHNICAL FIELD

The present invention is directed to materials suitable for encapsulation layers and dielectric layers for organic electronic devices. Devices having dielectric layers and encapsulation layers prepared by such methods are further provided. The invention finds utility, for example, in the field of electronics.

BACKGROUND

Organic electronic devices are widely used in a variety of applications. These are electrical devices such as light emitting diodes, transistors, and photovoltaic cells, that include the use of organic materials as one or more of the device components (e.g., dielectric layers, electrode layers, etc.). Organic electroluminescent devices (ELDs) such as organic light emitting diodes (OLEDs) have in recent years become commercially important. Organic materials are desirable for their light weight and low cost. Unfortunately, many organic materials suffer from low stability and low durability as compared with metallic materials.

Organic electronic devices are typically constructed with two electrodes. In the case of ELDs, an electroluminescent material is in electrical contact with both electrodes, and forms a conduction path between the electrodes. One electrode functions as a electron-injection layer, while the other electrode functions as a hole-injection layer. In some arrangements of the component layers of ELDs, a dielectric layer is present. For example, a dielectric layer may be present between all or a portion of the electrodes. Dielectric layers are also important component layers of other electronic devices such as transistors and capacitors.

An important aspect in the construction and operation of organic electric devices (OEDs) is the process of encapsulation, whereby the various component layers are protected from environmental hazards such as moisture and oxygen. For example, in the case of OLEDs, a physical barrier may be needed to protect the OLED component layers (e.g., organic and cathode materials). A common method for preparing such a barrier involves physically mating a top glass (or other suitable material) layer over, but usually not touching, the OLED device with an epoxy border. The glass, together with its epoxy border, provide the necessary environmental protection required for long-lived OLED usage. This method has a number of limitations, however, including oxygen/moisture permeability issues with the epoxy border, difficulty of manufacture, and inflexibility of the glass top layer.

In recent years, attempts have been made to develop cheaper, more rapid and more effective methods for encapsulating OEDs, particularly OLEDs. In one method, known as "direct thin-film" encapsulation, alternating and repeating layers of an organic material and a barrier layer are used. Typical organic materials are acrylate or the like, while typical barrier layer comprise a sputtered metal, metal-oxide or a dielectric layer.

One of the problems of the direct thin-film encapsulation method occurs when the barrier layer contains point defects (i.e. pin holes) in its surface. Such defects severely reduce the usefulness of the barrier layer, as they increase the amount of harmful contaminants able to cross the barrier layer. One solution to this problem is to increase the thickness of the barrier layer to eliminate defects that extend entirely through the barrier. Unfortunately, thicker barrier layers increase the weight and cost of the devices, and reduce the transparency and flexibility of the encapsulation.

Furthermore, direct thin-film encapsulation has additional drawbacks for certain types of ELDs. For example, in some OLEDs, such as those described in U.S. Pat. Nos. 6,800,722 and 6,593,687, the cathode, dielectric, and anode layers are deposited on a substrate to form the OLED stack. Cavities extending partially or completely through each of the layers are created, and a light emitting polymer (LEP) layer is deposited over the OLED stack. Within the cavities, the LEP makes contact with the anode and cathode layers. Light emission occurs in the cavity regions as electrons and holes flow through the LEP and between the anode and cathode layers. In such devices, the LEP layer forms the outermost (i.e., furthest from the substrate) layer of the OLED stack. Accordingly, the LEP layer is exposed to, and potentially damaged by, encapsulation methods that involve depositing barrier layers by chemical or physical deposition methods. For example, the LEP layer can be damaged by reactive species or solvents when the encapsulating layers are deposited by metal sputtering, chemical vapor deposition, or solution deposition methods.

A further problem suffered by layered electronic devices is breakdown or leakage of the dielectric layer, which results in unwanted current flow between the electrodes or from one electrode to ground. Commonly, such breakdown or leakage occurs because of defects in the dielectric layer. Defects include cracks and pinholes that may form when the dielectric layer is deposited and/or cured. Traditional methods for overcoming such difficulties typically involve increasing the thickness of the dielectric layer. This approach is particularly undesirable for applications in which thinner dielectric layers are needed.

There remains a need in the art to overcome the abovementioned drawbacks, as well as generally to develop new methods and materials for effectively manufacturing and protecting OEDs such as ELDs. Ideal encapsulation methods and materials would utilize materials that are readily available or easily prepared, minimize the number of process steps, and/or provide highly reproducible results and effective barrier layers without damaging the OED components. Similarly, ideal materials and methods for forming dielectric layers would utilize readily available materials and would be capable of producing thin dielectric layers having minimal defects.

SUMMARY OF THE INVENTION

The present invention is directed to providing methods and materials for encapsulating organic electronic devices. The present invention is also directed to provided methods and materials for preparing dielectric layers in layered electronic devices.

In one aspect, there is provided a method for forming a dielectric layer in an electronic device comprising: (i) forming a barrier layer by depositing a barrier material directly or indirectly on a substrate, wherein the barrier material is a ceramic material; (ii) oxidizing the barrier layer to provide exposed functional groups; (iii) forming a bonding layer by depositing a layer of a bonding material on the barrier layer, wherein the bonding material is a silicon-containing material and comprises functional groups capable of reacting with the functional groups of the barrier layer; (iv) optionally oxidizing the bonding layer to provide exposed functional groups; and (v) optionally forming one or more pairs of additional barrier and bonding layers by repeating (i), (ii), (iii), and (iv).

In another aspect, there is provided an electronic device comprising a plurality of component layers disposed on a substrate and a dielectric layer comprising at least a first pair of layers of a barrier material and a cross-linked material, wherein the barrier material is a ceramic material and the cross-linked material is a silicon-containing polymer.

In another aspect, there is provided a method for encapsulating an electronic device comprising: (a) providing a substrate and an electronic device disposed thereon; (b) forming a barrier layer by depositing a barrier material directly or indirectly on the electronic device, wherein the barrier material is a ceramic material; (c) oxidizing the barrier layer to provide exposed functional groups; (d) forming a bonding layer by depositing a layer of a bonding material on the barrier layer, wherein the bonding material is a silicon-containing material and comprises functional groups capable of reacting with the functional groups of the barrier layer; (e) optionally oxidizing the bonding layer to provide exposed functional groups; and (f) optionally forming one or more pairs of additional barrier and bonding layers by repeating (b), (c), (d), and (e).

In another aspect, there is provided an encapsulated electronic device comprising: an electronic device comprising a plurality of component layers disposed on a substrate; and an encapsulation portion comprising a first pair of layers of a barrier material and a cross-linked material, wherein the barrier material is a ceramic material and the cross-linked material is a silicon-containing polymer.

Other aspects of the invention will be apparent from the description that follows, including the claims and examples.

DETAILED DESCRIPTION OF THE DISCLOSURE

Figure 1A:
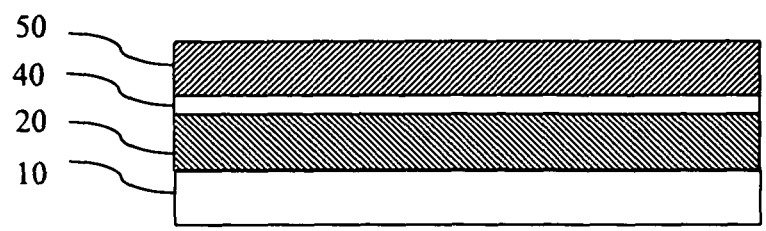
FIG. 1a-FIG. 1g provide depictions of representative organic electric devices that are suitable for using the encapsulation and dielectric layer methods and materials of the invention.

Before describing the present invention in detail, it is to be understood that unless otherwise indicated, this invention is not limited to any particular device, architecture, material, or method of preparation described herein, as such may vary. It is also to be understood that the terminology used herein is for the purpose of describing particular embodiments only, and is not intended to be limiting. The definitions provided herein are not meant to be mutually exclusive. For example, it will be appreciated that some chemical groups may fit into more than one definition.

The term "alkyl" as used herein refers to a branched or unbranched saturated hydrocarbon group typically although not necessarily containing 1 to about 24 carbon atoms, such as methyl, ethyl, n-propyl, isopropyl, n-butyl, isobutyl, t-butyl, octyl, decyl, and the like, as well as cycloalkyl groups such as cyclopentyl, cyclohexyl and the like. Generally, although again not necessarily, alkyl groups herein may contain 1 to about 18 carbon atoms, and such groups may contain 1 to about 12 carbon atoms. The term "lower alkyl" intends an alkyl group of 1 to 6 carbon atoms. "Substituted alkyl" refers to alkyl substituted with one or more substituent groups, and the terms "heteroatom-containing alkyl" and "heteroalkyl" refer to an alkyl substituent in which at least one carbon atom is replaced with a heteroatom, as described in further detail infra. If not otherwise indicated, the terms "alkyl" and "lower alkyl" include linear, branched, cyclic, unsubstituted, substituted, and/or heteroatom-containing alkyl or lower alkyl, respectively.

The term "alkenyl" as used herein refers to a linear, branched or cyclic hydrocarbon group of 2 to about 24 carbon atoms containing at least one double bond, such as ethenyl, n-propenyl, isopropenyl, n-butenyl, isobutenyl, octenyl, decenyl, tetradecenyl, hexadecenyl, eicosenyl, tetracosenyl, and the like. Generally, although again not necessarily, alkenyl groups herein may contain 2 to about 18 carbon atoms, and for example may contain 2 to 12 carbon atoms. The term "lower alkenyl" intends an alkenyl group of 2 to 6 carbon atoms. The term "substituted alkenyl" refers to alkenyl substituted with one or more substituent groups, and the terms "heteroatom-containing alkenyl" and "heteroalkenyl" refer to alkenyl in which at least one carbon atom is replaced with a heteroatom. If not otherwise indicated, the terms "alkenyl" and "lower alkenyl" include linear, branched, cyclic, unsubstituted, substituted, and/or heteroatom-containing alkenyl and lower alkenyl, respectively.

The term "alkynyl" as used herein refers to a linear or branched hydrocarbon group of 2 to 24 carbon atoms containing at least one triple bond, such as ethynyl, n-propynyl, and the like. Generally, although again not necessarily, alkynyl groups herein may contain 2 to about 18 carbon atoms, and such groups may further contain 2 to 12 carbon atoms. The term "lower alkynyl" intends an alkynyl group of 2 to 6 carbon atoms. The term "substituted alkynyl" refers to alkynyl substituted with one or more substituent groups, and the terms "heteroatom-containing alkynyl" and "heteroalkynyl" refer to alkynyl in which at least one carbon atom is replaced with a heteroatom. If not otherwise indicated, the terms "alkynyl" and "lower alkynyl" include linear, branched, unsubstituted, substituted, and/or heteroatom-containing alkynyl and lower alkynyl, respectively.

If not otherwise indicated, the term "unsaturated alkyl" includes alkenyl and alkynyl, as well as combinations thereof.

The term "alkoxy" as used herein intends an alkyl group bound through a single, terminal ether linkage; that is, an "alkoxy" group may be represented as —O-alkyl where alkyl is as defined above. A "lower alkoxy" group intends an alkoxy group containing 1 to 6 carbon atoms, and includes, for example, methoxy, ethoxy, n-propoxy, isopropoxy, t-butyloxy, etc. Substituents identified as "$C_1$-$C_6$ alkoxy" or "lower alkoxy" herein may, for example, may contain 1 to 3 carbon atoms, and as a further example, such substituents may contain 1 or 2 carbon atoms (i.e., methoxy and ethoxy).

The term "aryl" as used herein, and unless otherwise specified, refers to an aromatic substituent generally, although not necessarily, containing 5 to 30 carbon atoms and containing a single aromatic ring or multiple aromatic rings (such as 1 to 3 rings) that are fused together, directly linked, or indirectly linked (such that the different aromatic rings are bound to a common group such as a methylene or ethylene moiety). Aryl groups may, for example, contain 5 to 20 carbon atoms, and as a further example, aryl groups may contain 5 to 12 carbon atoms. For example, aryl groups may contain one aromatic ring or two fused or linked aromatic rings, e.g., phenyl, naphthyl, biphenyl, diphenylether, diphenylamine, benzophenone, and the like. "Substituted aryl" refers to an aryl moiety substituted with one or more substituent groups, and the terms "heteroatom-containing aryl" and "heteroaryl" refer to an aryl substituent, in which at least one carbon atom is replaced with a heteroatom, as will be described in further detail infra. If not otherwise indicated, the term "aryl" includes unsubstituted, substituted, and/or heteroatom-containing aryl substituents.

The term "aralkyl" refers to an alkyl group with an aryl substituent, and the term "alkaryl" refers to an aryl group with an alkyl substituent, wherein "alkyl" and "aryl" are as defined above. In general, aralkyl and alkaryl groups herein contain 6 to 30 carbon atoms. Aralkyl and alkaryl groups may, for example, contain 6 to 20 carbon atoms, and as a further example, such groups may contain 6 to 12 carbon atoms.

The term "olefinic group" intends a mono-unsaturated or di-unsaturated hydrocarbon group of 2 to 12 carbon atoms. Preferred olefinic groups within this class are sometimes herein designated as "lower olefinic groups," intending a hydrocarbon moiety of 2 to 6 carbon atoms containing a single terminal double bond. The latter moieties may also be termed "lower alkenyl."

The term "alkylene" as used herein refers to a difunctional saturated branched or unbranched hydrocarbon chain containing from 1 to 24 carbon atoms. "Lower alkylene" refers to alkylene linkages containing from 1 to 6 carbon atoms, and includes, for example, methylene ($-CH_2-$), ethylene ($-CH_2CH_2-$), propylene ($-CH_2CH_2CH_2-$), 2-methylpropylene ($-CH_2-CH(CH_3)-CH_2-$), hexylene ($-(CH_2)_6-$) and the like.

The term "amino" is used herein to refer to the group $-NZ^1Z^2$ wherein $Z^1$ and $Z^2$ are hydrogen or nonhydrogen substituents, with nonhydrogen substituents including, for example, alkyl, aryl, alkenyl, aralkyl, and substituted and/or heteroatom-containing variants thereof.

The term "heteroatom-containing" as in a "heteroatom-containing alkyl group" (also termed a "heteroalkyl" group) or a "heteroatom-containing aryl group" (also termed a "heteroaryl" group) refers to a molecule, linkage or substituent in which one or more carbon atoms are replaced with an atom other than carbon, e.g., nitrogen, oxygen, sulfur, phosphorus or silicon, typically nitrogen, oxygen or sulfur. Similarly, the term "heteroalkyl" refers to an alkyl substituent that is heteroatom-containing, the term "heterocyclic" refers to a cyclic substituent that is heteroatom-containing, the terms "heteroaryl" and heteroaromatic" respectively refer to "aryl" and "aromatic" substituents that are heteroatom-containing, and the like. Examples of heteroalkyl groups include alkoxyaryl, alkylsulfanyl-substituted alkyl, N-alkylated amino alkyl, and the like. Examples of heteroaryl substituents include pyrrolyl, pyrrolidinyl, pyridinyl, quinolinyl, indolyl, furyl, pyrimidinyl, imidazolyl, 1,2,4-triazolyl, tetrazolyl, etc., and examples of heteroatom-containing alicyclic groups are pyrrolidino, morpholino, piperazino, piperidino, tetrahydrofuranyl, etc.

"Hydrocarbyl" refers to univalent hydrocarbyl radicals containing 1 to about 30 carbon atoms, including 1 to about 24 carbon atoms, further including 1 to about 18 carbon atoms, and further including about 1 to 12 carbon atoms, including linear, branched, cyclic, saturated and unsaturated species, such as alkyl groups, alkenyl groups, aryl groups, and the like. "Substituted hydrocarbyl" refers to hydrocarbyl substituted with one or more substituent groups, and the term "heteroatom-containing hydrocarbyl" refers to hydrocarbyl in which at least one carbon atom is replaced with a heteroatom. Unless otherwise indicated, the term "hydrocarbyl" is to be interpreted as including unsubstituted, substituted, heteroatom-containing, and substituted heteroatom-containing hydrocarbyl moieties.

"Halo" or "halogen" refers to fluoro, chloro, bromo or iodo, and usually relates to halo substitution for a hydrogen atom in an organic compound. Of the halos, chloro and fluoro are generally preferred.

By "substituted" as in "substituted hydrocarbyl," "substituted alkyl," "substituted aryl," and the like, as alluded to in some of the aforementioned definitions, is meant that in the hydrocarbyl, alkyl, aryl, or other moiety, at least one hydrogen atom bound to a carbon (or other) atom is replaced with one or more non-hydrogen substituents. Examples of such substituents include, without limitation: functional groups such as halo, hydroxyl, sulfhydryl, $C_1$-$C_{24}$ alkoxy, $C_2$-$C_{24}$ alkenyloxy, $C_2$-$C_{24}$ alkynyloxy, $C_5$-$C_{20}$ aryloxy, acyl (including $C_2$-$C_{24}$ alkylcarbonyl (—CO-alkyl) and $C_6$-$C_{20}$ arylcarbonyl (—CO-aryl)), acyloxy (—O-acyl), $C_2$-$C_{24}$ alkoxycarbonyl (—(CO)—O-alkyl), $C_6$-$C_{20}$ aryloxycarbonyl (—(CO)—O-aryl), halocarbonyl (—CO)—X where X is halo), $C_2$-$C_{24}$ alkylcarbonato (—O—(CO)—O-alkyl), $C_6$-$C_{20}$ arylcarbonato (—O—(CO)—O-aryl), carboxy (—COOH), carboxylato (—COO$^-$), carbamoyl (—(CO)—NH$_2$), mono-substituted $C_1$-$C_{24}$ alkylcarbamoyl (—(CO)—NH($C_1$-$C_{24}$ alkyl)), di-substituted alkylcarbamoyl (—(CO)—N($C_1$-$C_{24}$ alkyl)$_2$), mono-substituted arylcarbamoyl (—(CO)—NH-aryl), thiocarbamoyl (—(CS)—NH$_2$), carbamido (—NH—(CO)—NH$_2$), cyano (—C≡N), isocyano (—N$^+$≡C$^-$), cyanato (—O—C≡N), isocyanato (—O—N$^+$≡C$^-$), isothiocyanato (—S—C≡N), azido (—N=N$^+$=N$^-$), formyl (—(CO)—H), thioformyl (—(CS)—H), amino (—NH$_2$), mono- and di-($C_1$-$C_{24}$ alkyl)-substituted amino, mono- and di-($C_5$-$C_{20}$ aryl)-substituted amino, $C_2$-$C_{24}$ alkylamido (—NH—(CO)-alkyl), $C_5$-$C_{20}$ arylamido (—NH—(CO)-aryl), imino (—CR=NH where R=hydrogen, $C_1$-$C_{24}$ alkyl, $C_5$-$C_{20}$ aryl, $C_6$-$C_{20}$ alkaryl, $C_6$-$C_{20}$ aralkyl, etc.), alkylimino (—CR=N(alkyl), where R=hydrogen, alkyl, aryl, alkaryl, etc.), arylimino (—CR=N (aryl), where R=hydrogen, alkyl, aryl, alkaryl, etc.), nitro (—NO$_2$), nitroso (—NO), sulfo (—SO$_2$—OH), sulfonato (—SO$_2$—O$^-$), $C_1$-$C_{24}$ alkylsulfanyl (—S-alkyl; also termed "alkylthio"), arylsulfanyl (—S-aryl; also termed "arylthio"), $C_1$-$C_{24}$ alkylsulfinyl (—(SO)-alkyl), $C_5$-$C_{20}$ arylsulfinyl (—(SO)-aryl), $C_1$-$C_{24}$ alkylsulfonyl (—SO$_2$-alkyl), $C_5$-$C_{20}$ arylsulfonyl (—SO$_2$-aryl), phosphono (—P(O)(OH)$_2$), phosphonato (P(O)(O$^-$)$_2$), phosphinato (—P(O)(O$^-$)$_2$), phospho (—PO$_2$), and phosphino (—PH$_2$), mono- and di-($C_1$-$C_{24}$ alkyl)-substituted phosphino, mono- and di-($C_5$-$C_{20}$ aryl)-substituted phosphino; and the hydrocarbyl moieties $C_1$-$C_{24}$ alkyl (including $C_1$-$C_{18}$ alkyl, further including $C_1$-$C_{12}$ alkyl, and further including $C_1$-$C_6$ alkyl), $C_2$-$C_{24}$ alkenyl (including $C_2$-$C_{18}$ alkenyl, further including $C_2$-$C_{12}$ alkenyl, and further including $C_2$-$C_6$ alkenyl), $C_2$-$C_{24}$ alkynyl (including $C_2$-$C_{18}$ alkynyl, further including $C_2$-$C_{12}$ alkynyl, and further including $C_2$-$C_6$ alkynyl), $C_5$-$C_{30}$ aryl (including $C_5$-$C_{20}$ aryl, and further including $C_5$-$C_{12}$ aryl), and $C_6$-$C_{30}$ aralkyl (including $C_6$-$C_{20}$ aralkyl, and further including $C_6$-$C_{12}$ aralkyl). In addition, the aforementioned functional groups may, if a particular group permits, be further substituted with one or more additional functional groups or with one or more hydrocarbyl moieties such as those specifically enumerated above. Analogously, the above-mentioned hydrocarbyl moieties may be further substituted with one or more functional groups or additional hydrocarbyl moieties such as those specifically enumerated.

When the term "substituted" appears prior to a list of possible substituted groups, it is intended that the term apply to every member of that group. For example, the phrase "substituted alkyl and aryl" is to be interpreted as "substituted alkyl and substituted aryl."

Unless otherwise specified, reference to an atom is meant to include isotopes of that atom. For example, reference to H is meant to include $^1$H, $^2$H (i.e., D) and $^3$H (i.e., T), and reference to C is meant to include $^{12}$C and all isotopes of carbon (such as $^{13}$C).

The methods and materials of the invention are suitable for preparing encapsulated organic electrical devices (OEDs) such as organic electroluminescent devices. The encapsulation methods and materials of the invention may be used to increase the stability of OEDs against degradation due to exposure to reactive chemicals in the environment. For example, using the encapsulation methods of the invention, OEDs can be made having a longer shelf life under a variety of environmental conditions compared with OEDs using other encapsulation methods. Alternatively or in addition, the encapsulation methods of the invention are not subject to certain drawbacks associated with glass plate and epoxy encapsulation methods. In some embodiments, for example, the encapsulated OEDs of the invention are more flexible, lighter in weight, and/or more resistant to environmental poisons than OEDs using traditional encapsulation methods.

In addition, the method and materials of the invention are suitable for preparing dielectric layers in OEDs. In preferred embodiments, the dielectric layers prepared according to the invention contain fewer defects compared with traditional dielectric layers of similar thickness. Such dielectric layers allow the preparation of OEDs with improved device performance for any given thickness. The dielectric layers according to the invention may be deposited over any topology Organic electronic devices of a variety of architectures can be used in conjunction with the encapsulation methods of the invention. For example, electroluminescent devices, photovoltaic devices, and transistor devices are within the scope of the invention. Some preferred OEDs are provided in PCT/US2008/010075, filed Aug. 25, 2008, PCT/US2008/001025, filed Jan. 24, 2008, U.S. Provisional Application Ser. No. 60/957,481, filed Aug. 23, 2007, U.S. application Ser. No. 11/900,478, filed Sep. 11, 2007, and U.S. Pat. No. 6,593,687, issued Jul. 15, 2003. The contents of each of these references pertaining to the OEDs disclosed therein are incorporated herein by reference.

The OEDs suitable for encapsulation and/or for incorporating a dielectric layer using the methods of the invention may be electroluminescent devices such as organic light emitting diodes (OLEDs) (as used herein, unless specified otherwise, the term OLED includes polymer light emitting diodes (PLEDs)). Typical OLED devices comprise two electrodes separated by an intermediate layer. One of the electrodes may function as a substrate, thereby acting as both a structural element upon which other layers are disposed and a functional element of the OLED. This is particularly suitable when the electrode is made from a transparent conductive material such as indium tin oxide. Alternatively, a substrate that is a separate component from the electrodes may be used. The two electrodes function individually as either an electron injection electrode or a hole injection electrode. They may also be referred to herein as anodes and cathodes. Furthermore, the electrodes may be referred to herein as top electrodes and bottom electrodes, since the OEDs described herein may be configured such that the hole injection layer is closest to the substrate or the electron injection layer is closest to the substrate. In other words, the arrangement of the electrodes with respect to the substrate may be interchanged. It will therefore be appreciated that the examples provided herein are not meant to be limiting insofar as they show only one particular orientation (e.g., the anode is closest to the substrate), but are provided merely for illustrative purposes.

In some embodiments, the intermediate layer is an electroluminescent layer comprising an electroluminescent material. For example, FIG. 1a provides an illustration of an OLED device. In FIG. 1a, substrate 10 is covered by a bottom electrode 20. An electroluminescent material forms electroluminescent layer 40, and is disposed on bottom electrode 20. The electroluminescent layer 40 may be covalently bonded to bottom electrode 20, but in preferred embodiments the bonding is via Van der Waals forces. Top electrode 50 is in contact with electroluminescent layer 40. Typically, although not necessarily, the various component layers (i.e., anode, EL material, and cathode) are substantially uniform in thickness and composition across the substrate.

In other embodiments, the intermediate layer is a dielectric layer comprising a dielectric material, and a separate electroluminescent layer is also present. Examples of such embodiments are cavity ELDs, such as cavity organic light emitting diodes (COLEDs), in which a plurality of cavities extend through at least one electrode and the dielectric layer. FIGS. 1b, 1c, 1d, and 1e provide examples of COLED device architectures. The dielectric layers in these and other OEDs may be prepared with conventional materials according to conventional methods (e.g., spin coating, etc.), or they may be prepared according to the alternating barrier/bonding layer disclosed herein.

Figure 1B:
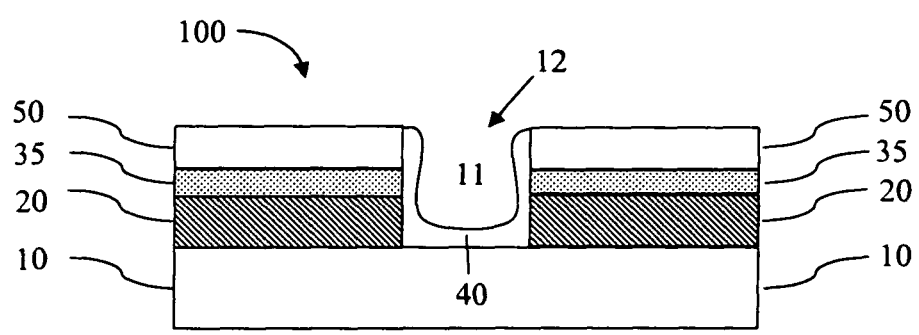

In FIG. 1b, device 100 is constructed from a layered structure on substrate 10 having cavity 11 extending through the layered structure. The layered structure comprises a bottom electrode layer 20, a dielectric layer 35, and a top electrode layer 50, wherein the dielectric layer is interposed between the bottom and top electrode layers. The cavity 11 extends from opening 12 entirely through the layered structure and terminates at the substrate 10. The cross-section of cavity 11 may be, for example, in the shape of a circle, square, triangle, or other shape, or the cavity may have no particular shape. Cavity 11 may have a diameter in the range of about 0.1 μm to about 5.0 μm, or between about 0.3 μm to about 2.0 μm. An electroluminescent material 40 is shown contacting each layer of the device within the interior cavity surface. Conformal contact with each region of the interior cavity is preferred. At a minimum, however, the electroluminescent material 40 must provide electrical contact with, and form a conductive pathway between, both electrodes.

Figure 1C:
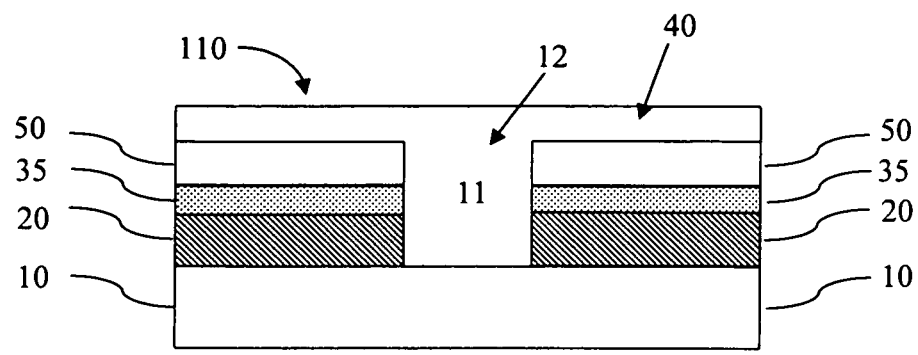

A further example embodiment of a cavity-emission ELD is shown in FIG. 1c, in which the electroluminescent material 40 completely fills the cavity and further coats electrodes 50.

Figure 1D:
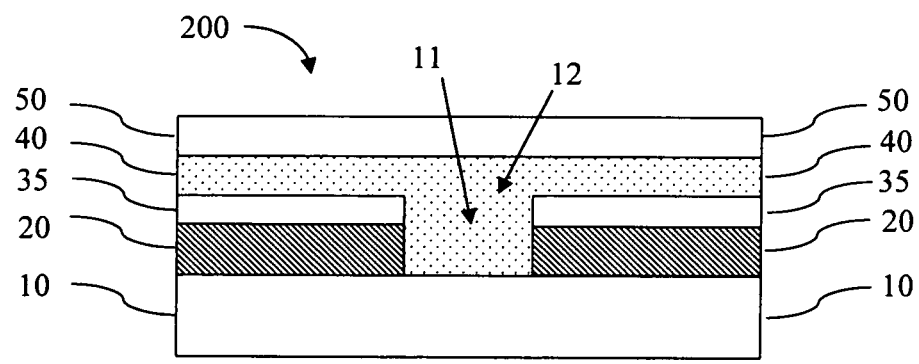

A still further example of a cavity-emission ELD structure is shown in FIG. 1d. Device 200 is constructed from a layered structure on substrate 10 having cavity 11 extending through a portion of the layered structure. The layered structure comprises a bottom electrode layer 20, a dielectric layer 35, a top electrode layer 50, and an electroluminescent material layer 40. The dielectric layer is interposed between the bottom electrode and the electroluminescent material so as to direct electrons through cavity 11.

Figure 1E:
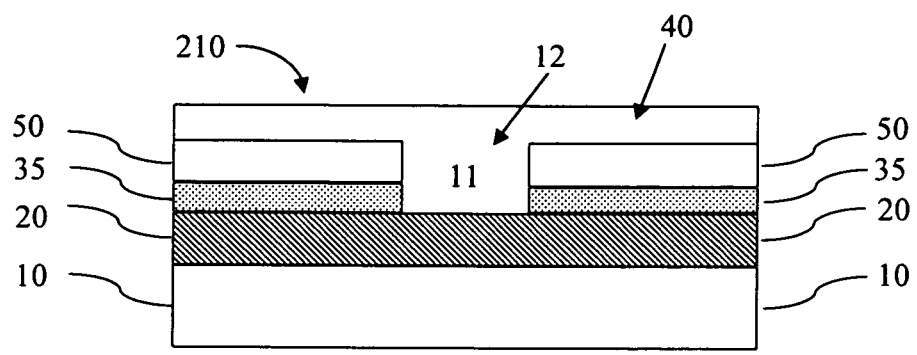

A still further example of a cavity-emission ELD structure is shown in FIG. 1e. Device 210 is a layered structure on substrate 10 having cavity 11 extending through top electrode 50 and dielectric layer 35. Cavity 11 terminates at bottom electrode 20. An electroluminescent material forms electroluminescent layer 40, which fills cavity 11 and contacts both bottom electrode 20 and top electrode 50. The COLED device of FIG. 1e is similar to that of FIG. 1c, except that the cavities do not extend through the bottom electrode. It will be appreciated that such COLED devices (i.e., where the cavities do not extend through the bottom electrode) may also be constructed using the arrangements shown in FIGS. 1b and 1d.

Figure 1F:
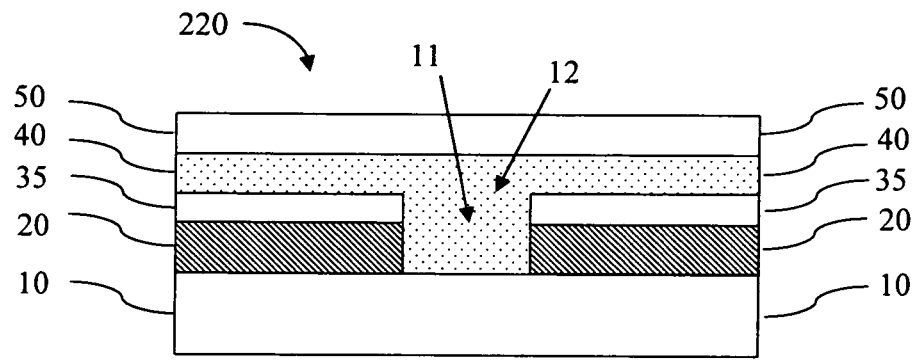
Figure 1G:
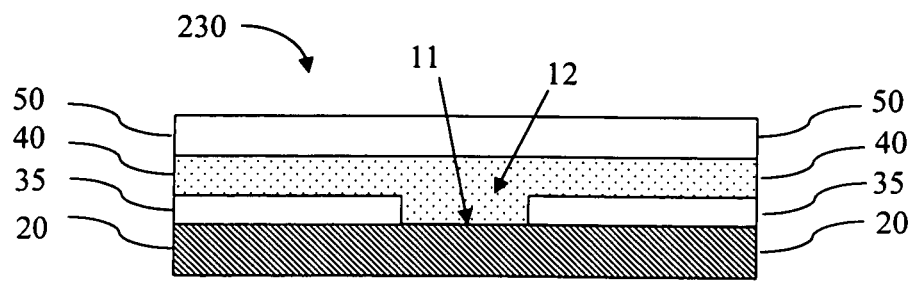

A still further example of a cavity-emission ELD structure is shown in FIG. 1f. Device 220 comprises substrate 10 and bottom electrodes 20 disposed thereon. Bottom electrode 20 is formed from a transparent material (such as, for example ITO or IZO), and substrate 10 is also formed from a transparent material (such as an organic polymer or silicon dioxide). Dielectric layer 35, electroluminescent layer 40, and top electrode 50 are present, as well as cavity 11. In the device shown in FIG. 1f, cavity 11 extends through transparent bottom electrode layer 20. An alternative device 230 is shown in FIG. 1g, in which cavity 11 does not extend through bottom transparent electrode layer 20. A separate substrate is optional (and not shown in FIG. 1g) since the bottom transparent electrode layer 20 does not contain cavities that would compromise the structural stability of the electrode layer.

It will be appreciated that COLED devices such as those described herein will have a plurality (i.e., and array) of cavities throughout the device.

In the OLED devices described above, the electron-injection electrode may optionally comprise an electron-accepting moiety and a silicon-containing adhesive material (not shown in the figures), as described in co-pending PCT application Serial No. PCT/US2008/010075, filed Aug. 25, 2008. For example, the surface of an electron-injection electrode may be covalently attached through oxygen linkages to a hydroxy-functionalized siloxane material (such as the siloxane materials described in more detail infra) and further covalently attached to an electron-accepting moiety. Suitable electron-accepting moieties include, for example, those comprising a metal diketonate (e.g., lithium, barium, beryllium, calcium, magnesium, sodium, potassium, cesium acetylacetonate, strontium, boron, aluminum, gallium, indium, or silver acetylacetonate, or combinations thereof) or a heteroatom-containing aromatic moiety, including polycyclic moieties (e.g., phthalic anhydride, 1,8-naphthalic anhydride, phthalic acid, 1,8-naphthalic acid, or nitrogen-analogues thereof, such as phthalimide, any of which being unsubstituted or substituted with one or more electron-withdrawing substituents such as halo or nitro). The silicon-containing adhesive and electron-accepting moiety form an intermediate layer that provides a more efficient transfer of energy when electrons travel from the electron-injection electrode into the electroluminescent material.

Figure 2:
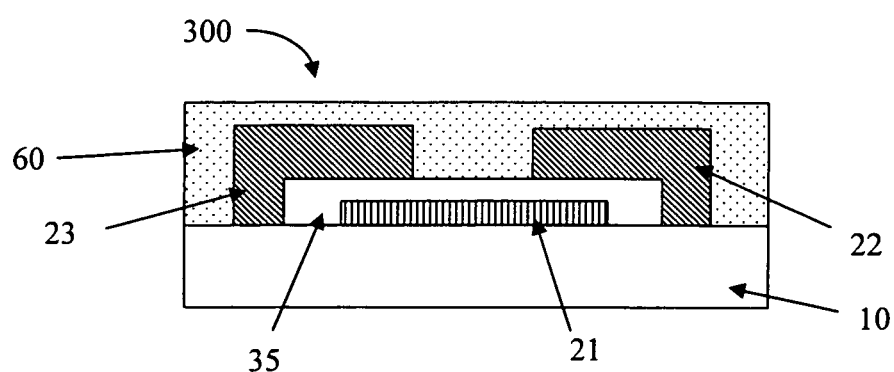
FIG. 2 provides a depiction of an organic electric devices suitable for using the encapsulation and dielectric layer methods and materials of the invention.

The OEDs may also be organic transistors. Such devices include, for example, organic thin film transistors (TFTs) such as device 300 shown in FIG. 2. In FIG. 2, gate electrodes 21 is disposed on substrate 10 and covered with dielectric layer 35. Source electrode 22 and drain electrode 23 are disposed on dielectric 35, and active layer 60 (comprising a semiconductor material such as pentacene, oligothiophene, or polythiophene) forms a path for electrical current between the electrodes. The OEDs may also be organic photovoltaic devices.

As used herein, the terms "OED," "device," and the like refer to a substrate and the device components as described above with respect to such devices. Typically, such device components include the layers shown in FIGS. 1a-1g and FIG. 2.

It will be appreciated that the dielectric layers shown in FIGS. 1a-1g and FIG. 2 may be prepared according to the methods of the invention (i.e., using alternating barrier and bonding layers with or without a protecting layer), or may be prepared using conventional materials and methods. It will further be appreciated that the encapsulation layers described herein may be used with any of the OED architectures shown in the figures, as well as other suitable OED architectures such as those described herein.

The materials that are suitable for the OEDs described above include a variety of organic and inorganic materials, as described in the patents and patent applications reference supra. Substrates may be any suitable material such as, for example, an inorganic material such as silicon dioxide, various silicon-based glasses such as soda-lime glass and borosilicate glass, aluminum oxide, zirconium oxide, sodium chloride, diamond, and/or the like. Examples of transparent or semi-transparent polymeric materials for transmitting emitted radiation include, but are not limited to, polyethylenenaphthalate, polycarbonate, polyethylene, polypropylene, polyester, polyimide, polyamides, polyacrylates and polymethacryates. The substrate may be rigid or flexible and may be of any suitable shape and configuration. Accordingly, in certain embodiments, a flexible polymeric substrate is provided. Optionally, an insulating layer may be included between the substrate and/or one or more of the other layers of the OED. Additionally, in certain embodiments, the substrate may be a semiconducting material, such as silicon or indium tin oxide, and may additionally contain microcircuitry, in which case, the electroluminescent device may comprise an integrated portion of a microcircuitry-driven device. For example, the substrate may, in some embodiments, function as one of the electrodes of the OED.

Electrodes may be made from any appropriate material, such as metals and conjugated organic compounds. Doped semiconductors and transparent materials are also suitable electrode materials. Example electrode materials include aluminum, titanium, copper, tungsten, silver, silicon, Indium Tin Oxide (ITO), Indium Zinc Oxide (IZO), pentacene, oligothiophenes and polythiophenes such as Poly(3,4-ethylenedioxythiophene) (PEDOT), carbon nanotubes, and the like.

When prepared according to conventional methods, dielectric layers may also be any suitable material capable of serving as a barrier between the electrodes to provide an electrical barrier and to prevent electrical shorting between the electrode layers. Materials include, for example, inorganic materials including oxides, nitrides, carbides, borides, or silicides (as described below for barrier materials) or organic materials such as polyimide, polyvinylidene fluoride, parylene, as well as various sol-gel materials and pre-ceramic polymers. In certain embodiments, the dielectric layer is substantially pinhole free and composed from a high-resistivity material having an electrical resistivity no less than about $10^8$ ohm-cm, preferably no less than about $10^{12}$ ohm-cm. Additional specific examples of suitable high-resistivity materials include, but are not limited to, silicon nitride, boron nitride, aluminum nitride, silicon oxide, titanium oxide, aluminum oxide.

As mentioned previously, in certain embodiments, the OEDs include an electroluminescent material, for instance, an electroluminescent layer. For COLEDs, the electroluminescent material is positioned at least partially in a cavity of the device. For instance, in certain embodiments, the electroluminescent material substantially or totally fills a cavity of the device. Again as previously mentioned, in certain embodiments the electroluminescent material forms an extended layer, for instance, the electroluminescent material may not only fill the dimensions of the cavity but may also form an additional layer that separates the electrode layer (e.g., electron-injection layer) from a dielectric layer.

The electroluminescent material may be composed of any suitable material capable of receiving a hole from the hole-injection layer and an electron from the electron-injection layer and emitting electromagnetic radiation (e.g., light) when the injected holes and electrons combine. Accordingly, in certain embodiments, the electroluminescent material may include any of a number of organic or inorganic compounds or mixtures thereof, such as multi-layers of organics or small molecules or the like. For instance, the electroluminescent layer may include a polymeric material or be composed of one or more small molecule materials. However, the material must contain at least one electroluminescent compound, for instance, an organic, inorganic or small molecule electroluminescent compound. In certain embodiments, the electroluminescent compound may include a simple organic molecule or complex polymer or copolymer. For example, a simple organic luminescent molecule may include tris(8-hydroxyquinolinato)-aluminum or perylene.

In certain embodiments, the electroluminescent material includes a polymer or copolymer. The molecular structure of a suitable polymer or copolymer may include a carbon-based or silicon-based backbone. The polymers and copolymers may be linear, branched, crosslinked or any combinations thereof, and may have a wide range of molecular weights from as low as about 5000 to more than 1,000,000. In the case of copolymers, the copolymers may be alternating, block, random, graft copolymers, or combinations thereof. Examples of suitable electroluminescent polymers useful in conjunction with the present invention include, but are not limited to, conjugated polymers such as, polyparaphenylenes, polythiophenes, polyphenylenevinylenes, polythienylvinylenes, polyfluorenes, 1,3,4-oxadiazole-containing polymers, and various derivatives and copolymers thereof.

An exemplary electroluminescent polymer is a poly(arylene-vinylene) polymer that has the general structure) —Ar$^1$—C(R$^{10}$)═C(R$^{11}$)—, wherein Ar$^1$ is arylene, heteroarylene, substituted arylene or substituted heteroarylene containing one to three aromatic rings, and R$^{10}$ and R$^{11}$ are independently selected from the group consisting of hydrido, halo, cyano, hydrocarbyl, substituted hydrocarbyl, heteroatom-containing hydrocarbyl, and substituted heteroatom-containing hydrocarbyl, or R$^{10}$ and R$^{11}$ may together form a triple bond. Furthermore, Ar$^1$ may be substituted with, for example, an amine or arylamine substituent. The substituents on R$^{10}$ and R$^{11}$ are generally hydrido but may also be halo (particularly chloro or fluoro) or cyano, or substituted or unsubstituted alkyl, alkoxy, alkenyl, alkynyl, aryl and heteroaryl.

Another exemplary electroluminescent polymer material that is described in U.S. Pat. No. 6,414,104, is an arylamine-substituted poly(arylene-vinylene) polymer that contains monomer units having the general structure as follows:

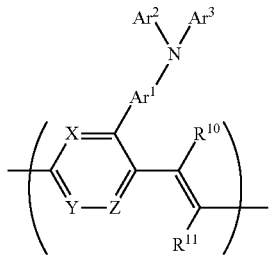

Wherein: X, Y and Z are independently selected from the group consisting of N, CH and CR$^{12}$ wherein R$^{12}$ is halo, cyano, alkyl, substituted alkyl, heteroatom-containing alkyl, aryl, heteroaryl, substituted aryl, or substituted heteroaryl, or wherein two R$^{12}$ moieties on adjacent carbon atoms may be linked to form an additional cyclic group; Ar$^1$ is as defined above; Ar$^2$ and Ar$^3$ are independently selected from the group consisting of aryl, heteroaryl, substituted aryl and substituted heteroaryl containing one or two aromatic rings; and R$^{10}$ and R$^{11}$ are as defined above.

In the formula above, the polymer is a poly(phenylene vinylene) derivative when X, Y and Z are all CH. When at least one of X, Y and Z is N, the aromatic ring will be, for example, substituted or unsubstituted pyridinyl, pyridazinyl, pyrimidinyl, pyrazinyl, 1,2,4-triazinyl, or 1,2,3-triazinyl. For instance, one of X, Y and Z may be CH and the other two may be either CH or CR$^{12}$, wherein R$^{12}$ may be a heteroatom-containing alkyl, for instance, alkoxy, or a polyether substituent —CH$_2$(OCH$_2$CH$_2$)$_n$OCH$_3$ or —(OCH$_2$CH$_2$)$_n$OCH$_3$ group where n is may be 1 to 12, for instance, 1 to 6, such as 1 to 3.

The polymer may be a homopolymer or a copolymer with at least one additional type of monomer unit. For example, if the polymer is a copolymer, the additional monomer units may also be arylene-vinylene monomer units. Examples of specific polymers are poly(2-(4-diphenylamino-phenyl)-1,4-phenylene vinylene and poly(2-(3-diphenylaminophenyl)-1, 4-phenylene vinylene. Examples of specific polymers disclosed in U.S. Pat. No. 6,414,104 are poly(2-(4-diphenylamino-phenyl)-1,4-phenylene vinylene and poly(2-(3-diphenylaminophenyl)-1,4-phenylene vinylene. Electroluminescent polymers appropriate for use in this invention are also described in U.S. Pat. Nos. 6,723,828, 6,800,722, and 7,098,297, the disclosures of which (pertaining to electroluminescent polymers) are incorporated by reference herein. In those referenced patents there is disclosed a conjugated polymer containing monomer units having the structure:

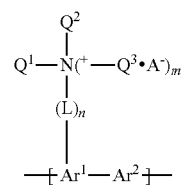

Wherein: Ar$^1$ and Ar$^2$ are independently selected from the group consisting of monocyclic, bicyclic and polycyclic arylene, heteroarylene, substituted arylene and substituted heteroarylene groups; L is alkylene, alkenylene, substituted alkylene, substituted alkenylene, heteroalkylene, heteroalkenylene, substituted heteroalkylene, substituted heteroalkenylene, arylene, heteroarylene, substituted arylene or substituted heteroarylene; m is zero or 1; n is zero or 1; Q$^1$ and Q$^2$ are independently selected from the group consisting of H, aryl, heteroaryl, substituted aryl, substituted heteroaryl, alkyl, and substituted alkyl, and Q$^3$ is selected from the group consisting of alkyl and substituted alkyl, with the proviso that when m is 1, Q$^1$ and Q$^2$ are other than H; and A$^-$ is a negatively charged counterion.

The electroluminescent material may also include blends of polymers such as those described above with other polymers, as well as a variety of copolymers.

The methods of the invention comprise providing an OED such as any of the devices described above. By "providing" is meant that the OED may be obtained from a general supplier (e.g., purchased), or the OED may be custom prepared specifically for use with the methods of the invention. The methods further comprise encapsulating the OEDs. This is particularly desirable when the uppermost layer of the OED (i.e., the layer that is most distal to the substrate) comprises an organic material. For example, as described above, electroluminescent material 40 in FIGS. 1b and 1c may comprise an organic electroluminescent material. Furthermore, electrodes 50 in FIGs. 1a, 1b, and 1d may comprise an organic conducting or semiconducting material, as described herein. Furthermore, active layer 60 in FIG. 1e may comprise an organic semiconductor material. Such organic materials are susceptible to degradation from exposure to environment factors such as air and water. Although less critical to proper device performance, encapsulation can be useful even in cases where a metal electrode material forms the uppermost OED component layer (such as, for example, shown in FIG. 1a).

As used herein, the terms "encapsulation portion," "encapsulation," and the like refer to the inert components that are deposited over an OED, typically to protect the OED from environmental factors such as moisture and oxygen. Generally, such encapsulation components include one or more layers selected from barrier layers, bonding layers, and protective layers.

In preferred embodiments, encapsulation of the OED is provided by depositing barrier and bonding layers, wherein the barrier layer is formed from a barrier material and the bonding layer is formed from a bonding material. As used herein, the term "encapsulation pair" refers to a pair of layers—one barrier layer and one bonding layer—in contact with each other. In some embodiments, the lowest encapsulation layer is deposited directly on the highest OED component layer(s). In other embodiments, a protective layer separates the lowest encapsulation layer from the highest OED component layer(s). By "lowest" is meant the layer that is most proximal to the substrate. Typically, the lowest encapsulating layer is the layer that is deposited first after the OED is provided. By "highest" (also "uppermost") is meant the layer(s) that is/are most distal to the substrate. The highest OED component layer may be, for example, an electrode layer, an electroluminescent layer, or a combination thereof (e.g., as shown in FIG. 1a, 1c, or 1b, respectively).

The barrier material is a non-conducting material that is capable of providing a barrier against one or more reactive environmental components such as oxygen, water, UV radiation, ozone, and the like. Examples of suitable barrier materials include ceramic materials selected from oxides of aluminum, silicon, titanium, tungsten, magnesium, zirconium, or calcium, nitrides of silicon, tungsten, aluminum, zirconium, chromium, titanium, tantalum, molybdenum, gallium, or boron, carbides of silicon, titanium, vanadium, zirconium, iron, or boron, borides of titanium or iron, and silicides of tungsten and titanium. For example, the barrier material may be $Al_2O_3$, $SiO_2$, $TiO_2$, $ZrO_2$, TiN, $Si_3N_4$, AlN, GaN, BN, TiB, $TiB_2$, $TaB_2$, SiC, and $TiSi_2$ or the like. Variations and derivatives of such ceramics are also within the scope of this disclosure, including compounds such as titanium carbon nitride (TiCN), and titanium aluminum nitride (TiAlN).

In some embodiments, it is desirable for the barrier layer(s) in an encapsulation portion to be as thin as possible. Frequently, however, deposition of such ceramic materials in thin layers (e.g., 10 nm to 1000 nm) results in layers that contain defects such as pinholes and cracks. Such defects are generally undesirable as they may lead to reduced ability of the barrier layer to protect the underlying OED from environmental factors. The present invention overcomes this difficulty by employing a bonding material that "fills" the defects of the barrier layer, as described in more detail infra.

In some embodiments, and in order to have the best possible adhesion between the barrier material and the bonding material, functional groups are present on the barrier material that are capable of forming covalent bonds with the bonding material. For example, hydroxyl groups, carboxylic acid groups, and protected versions of such groups (e.g., ethers, esters, amides, etc.) may be present on the barrier material. In some embodiments, functional groups are obtained via post-deposition functionalization of the barrier material. For example, the barrier layer may be oxidized via reaction with an oxidizing reagent (e.g., oxygen, peroxides, or plasma oxidation) or via the application of energy (e.g., UV radiation).

The bonding material (also referred to herein as a pre-adhesive material or a preceramic material) is a non-conductive material that is capable of forming a crosslinked polymeric network. In some embodiments, the bonding material is a silicon-containing material that may be organic or completely inorganic.

In preferred embodiments, the bonding material further includes complimentary reactive groups capable of forming covalent attachments to the functional groups of the barrier layer. Such reactive groups may be present in the bonding material prior to deposition on the OED, or may be created by post-deposition modification reactions carried out on the bonding material.

As an example, the bonding material may have the structure of the preceramic materials described in U.S. Pat. No. 5,246,738 to Blum, issued Sep. 21, 1993 ("Hydridosiloxanes as Precursors to Ceramic Products"), and in co-pending U.S. patent application Ser. No. 12/330,319, filed Dec. 8, 2008, and may be synthesized by the methods disclosed therein. The disclosure of these documents pertaining to such materials and methods is hereby incorporated by reference.

For example, the bonding material may comprise repeat units having the structure of formula (II):

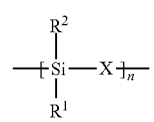

(I)

wherein $R^1$ and $R^2$ are independently selected from H, OH, $C_1$-$C_{30}$ hydrocarbyl, organometallic, halocarbyl, and organosilyl, each of which may be optionally substituted and optionally heteroatom containing, and wherein X is selected from —O—, and —$NR^3$—, wherein $R^3$ is hydrocarbyl. For example, each $R^1$ and $R^2$ may be H, OH, or hydrocarbyl. In preferred embodiments, $R^1$ and $R^2$ are selected from H, OH, $C_1$-$C_{20}$ alkyl, $C_2$-$C_{20}$ alkenyl, $C_2$-$C_{20}$ alkynyl, $C_1$-$C_{20}$ alkoxy, $C_5$-$C_{20}$ aryl, $C_5$-$C_{20}$ aryloxy, $C_6$-$C_{20}$ aralkyl, and $C_6$-$C_{20}$ alkaryl. In further preferred embodiments, $R^1$ and $R^2$ are selected from substituted or unsubstituted $C_1$-$C_{20}$ alkyl, substitute or unsubstituted heteroatom-containing $C_1$-$C_{20}$ alkyl, substituted or unsubstituted $C_2$-$C_{20}$ alkenyl, substitute or unsubstituted heteroatom-containing $C_2$-$C_{20}$ alkenyl, substituted or unsubstituted $C_2$-$C_{20}$ alkynyl, substitute or unsubstituted heteroatom-containing $C_2$-$C_{20}$ alkynyl, substituted or unsubstituted $C_5$-$C_{20}$ aryl, substitute or unsubstituted $C_5$-$C_{20}$ heteroaryl, substituted or unsubstituted $C_5$-$C_{20}$ aralkyl, substitute or unsubstituted heteroatom-containing $C_5$-$C_{20}$ aralkyl, substituted or unsubstituted $C_6$-$C_{20}$ alkaryl, and substitute or unsubstituted heteroatom-containing $C_5$-$C_{20}$ alkaryl. In some embodiments, $R^2$ is OH and $R^1$ is selected from alkyl, alkenyl, alkynyl, alkoxy, aryl, aryloxy, aralkyl, and alkaryl, any of which may be heteroatom containing, and any of which may be unsubstituted or substituted with one or more groups selected from halo, hydroxyl, alkyl, and aryl. In some embodiments, $R^1$ is lower alkyl, such as methyl or ethyl, and $R^2$ is H, OH, or $C_1$-$C_{20}$ alkoxy. In some preferred embodiments, X is —O—, such that the bonding material is a siloxane or polysiloxane material.

Furthermore in formula (I), n is an integer that is greater than or equal to 1. Accordingly, monomers, dimers, trimers, and higher-order materials such as oligomers and polymers are suitable. It will be appreciated that the bonding material may comprise a mixture of different compounds each comprising repeat units having the structure of formula (I) but having various values of n.

For example, the bonding material may comprise repeat units having the formula $[R^1Si(OH)O]$, $[R^1Si(OR^{2a})O]$ and/or $[R^1Si(H)O]$, wherein $R^1$ is as defined above and $R^{2a}$ is selected from hydrocarbyl and organosilyl.

Upon curing the bonding material may comprise crosslinked units having the structure —$[Si(R^2)(X)_{1.5}]$—, wherein: $R^2$ is selected from H, hydroxyl, fluorocarbyl, and hydrocarbyl; X is selected from —O— and —$NR^3$—; and $R^3$ is selected from alkyl and aryl. For example, X is —O— and $R^2$ is selected from alkyl, alkenyl, alkynyl, alkoxy, aryl, aryloxy, aralkyl, and alkaryl, any of which may be heteroatom containing, and any of which may be unsubstituted or substituted with one or more groups selected from halo, hydroxyl, alkyl, and aryl. Further details of the cured bonding material are provided herein infra.

The bonding material may be prepared, for example, using a dehydrocoupling reaction and/or hydrosilylation reaction as described in U.S. Ser. No. 12/330,319. For example, the bonding material may be prepared by the reaction of polyhydridomethylsiloxane (PHMS) with water and/or an alcohol in the presence of a transition metal catalyst such as $Ru_3(CO)_{12}$, $H_2PtCl_6$, or the like. The bonding material, once prepared, can be purified of the transition metal catalyst using, for example, silica gel or charcoal column as is typical in the art.

Deposition of the barrier and bonding materials can be accomplished by any appropriate method. For example, the barrier and bonding materials may be vacuum deposited, such as using chemical vapor deposition (CVD), physical vapor deposition (PVD), molecular beam epitaxy (MBE), atomic layer deposition (ALD), or sputtering. Other methods include chemical solution deposition methods, such as sol-gel processing, dip coating, spin coating, spray coating, and the like. It will be appreciated that, depending upon the selected materials, as well as the selected method of deposition, the barrier and/or bonding layers may be formed from a precursor material that is converted (either spontaneously or upon exposure to suitable conditions and/or reagents) to the barrier and/or bonding material after or during deposition.

For example, $Al_2O_3$ is conveniently (although not necessarily) deposited using sputtering or by physical vapor deposition of alumina particles, and $SiO_2$ is conveniently (although not necessarily) deposited using CVD. Any of the precursor compounds known in the art may be used for preparing the barrier materials described herein.

In a preferred embodiment, the bonding material is deposited as a crosslinkable material. Curing of the bonding material creates a crosslinked layer. Curing can be carried out using any method that is effective in crosslinking the bonding material. For example, application of heat and/or UV radiation for a predetermined period of time is an effective method of curing bonding materials that crosslink at elevated temperature and/or exposure to radiation. Alternatively or in addition, a crosslinking catalyst such as an organic amine or another organic base may be used to crosslink the bonding material. It will be appreciated that, in some cases, there is no need to induce the curing reaction (e.g., by applying heat), as such reaction will occur spontaneously. In preferred embodiments, any byproducts that result from the curing reaction are small molecules (e.g., water, methanol, and the like) that are conveniently removed by solvent washes.

When more than one bonding layer is deposited on an OED (see discussion of multiple encapsulation pairs, infra), curing of the bonding material may be carried out after each deposition. Alternatively, all of the bonding layers may be cured at one time after all depositions have been completed. Alternatively, some combination of these options (i.e., multiple curings, but fewer in number than the number of depositions of bonding material) is also suitable.

When the bonding material is a polysiloxane and/or polysilane, curing the bonding material will typically form a crosslinked material comprising repeat units having the structure of formula (V):

$$[R^1SiO_{1.5}] \qquad (V)$$

wherein $R^1$ is as defined previously. Where the bonding material comprised repeat units having the structure of formula (IV), it will be appreciated that the crosslinked material will also have such units.

In preferred embodiments, at least one encapsulation pair is deposited to form the encapsulation portion. In some embodiments, the encapsulation portion may comprise a plurality of encapsulation pairs. For example, the encapsulation portion may comprise 2, 3, 4, 5, 6, 7, 8, 9, or 10 encapsulation pairs, corresponding to 2, 3, 4, 5, 6, 7, 8, 9, or 10 bonding layers alternating with 2, 3, 4, 5, 6, 7, 8, 9, or 10 barrier layers. In preferred embodiments, deposition of each barrier layer is followed by deposition of a barrier layer, such that the barrier and bonding layers alternate. By this method, each barrier layer is in contact with at least one bonding layer.

For example, after formation of the first encapsulation pair, the steps necessary to form an encapsulation pair may be repeated an additional one to 10 times, such that from one to 10 additional barrier and bonding layers are formed.

When more than one encapsulation pair is deposited, the methods of the invention may further comprise carrying out a functionalization reaction to provide functional groups on a bonding layer prior to any subsequent deposition of a further barrier layer. When the bonding material is a siloxane or polysiloxane material comprising alkyl groups, for example, such a functionalization reaction may involve oxidizing the alkyl groups to provide hydroxyl groups. The hydroxyl groups thus created may be suitable for bonding to an overlying barrier layer. Accordingly, in some preferred embodiments, each bonding and barrier layer of the encapsulation portion (with the exception of the lowermost layer, which contacts either the uppermost OED layer or the protective layer, when a protective layer is present) is bonded to the layer immediately above and/or to the layer immediately below.

Without wishing to be bound by theory, it is theorized that since the bonding layers are deposited prior to crosslinking, the flowable bonding material conforms to the surface of the underlying barrier layer, and fills any irregularities or defects such as pinholes and cracks. Thus, the surface of an encapsulation pair is relatively smooth and free of defects. This "filling" of defects in the barrier layer by the bonding layer improves the barrier properties of the encapsulation portions of the invention. The use of multiple encapsulation pairs even further improves the barrier properties of encapsulation portions. Thus, in some embodiments, at least two encapsulation pairs are used with the OEDs described herein, and in some embodiments, at least three encapsulation pairs are used.

The thickness of the barrier and bonding layers may be independently selected to optimize the barrier properties of the encapsulation portion. Because defects in the barrier layer are "filled" upon deposition of an overlaying bonding layer, ultra-thin barrier layers are suitable for the devices described herein. For example, the thickness of each barrier layer is within the range of about 10 nm to about 1000 nm, or between about 100 nm and 500 nm. Each barrier layer may be, for example, less than 1000 nm, or less than 500 nm, or less than 250 nm. Also for example, the thickness of each bonding layer is within the range of about 1 nm to about 500 nm, or between about 10 nm and about 250 nm. Each bonding layer may be, for example, less than 500 nm, or less than 300 nm, or less than 100 nm, or less than 50 nm, or less than 10 nm. The thickness of the overall encapsulation package will vary depending upon the number and thickness of each encapsulation pair, but will typically be within the range of about 50 nm to about 5000 nm.

Alternatively or in addition to use as encapsulation layers, the barrier and bonding layers described herein may further be employed as dielectric layers. When employed as dielectric layers, the bonding and barrier layers together form an electrically non-conductive barrier between device electrodes, or between one electrode and ground. As described previously, multiple alternating pairs of barrier and bonding layers may be used as a dielectric layer. The thickness of each barrier layer is preferably less than about 100 nm, or within the range of about 5 nm to about 100 nm. Each barrier layer may be, for example, less than 80 nm, or less than 50 nm, or less than 25 nm. The thickness of each bonding layer is preferably less than about 100 nm, or within the range of about 1 nm to about 100 nm. Each bonding layer may be, for example, less than 100 nm, or less than 50 nm, or less than 25 nm. Overall, the thickness of the dielectric layer is preferably less than about 2000 nm, or within the range of about 6 nm to about 2000 nm For example, the overall thickness of the dielectric layer may be less than 2000 nm, or less than 1500 nm, or less than 1000 nm, or less than 500 nm, or less than 100 nm, or less than 50 nm, or less than 25 nm. Again, as described previously, each bonding layer may be cured individually, or all bonding layers may be cured in one single curing step. It will be appreciated that the location of the dielectric layer within the OED will depend upon the device architecture. Accordingly, in some embodiments, the dielectric layer is disposed directly on the bottom electrode.

In some embodiments, the barrier material is deposited directly on the electronic device (i.e., the uppermost layer of the OED). In some embodiments, however, the uppermost OED layer may be susceptible to degradation or damage by the process of depositing the lower encapsulation layers. For example, the uppermost OED layer will be directly exposed to the sputter (or CVD) process or exposed to solution processing chemicals (such as a siloxane or polysiloxane, and/or a solvent) when the encapsulation portion is deposited. When the uppermost OED layer is a material that is sensitive to degradation, such as a light emitting polymer (LEP) or other electroluminescent material, the device lifetime and efficiency may be reduced due to direct contact with reactive species such as the OH groups of the siloxane molecules, or the gas phase reactive ions and UV irradiation generated by the sputter or CVD process. This effect can be mitigated, for example, by using a thicker LEP layer. Where it is not desirable to use a thick LEP layer, the devices of the invention may include a protective layer formed from a protective material and disposed between the uppermost OED component layer and the encapsulation portion. In preferred embodiment, the protective layer shields the OED component layers from UV radiation and/or reactive chemical species during the deposition of the encapsulation layers. Accordingly, the methods of the invention may including forming a protective layer between the electronic device and the lowermost barrier layer by depositing a protective material on the electronic device prior to depositing the lowermost barrier layer. The protective material is deposited between the electronic device and the first pair of encapsulation layers.

The protective material is a material that may be deposited without the use of harsh or reactive conditions that are damaging to the OED component layers. In one embodiment, the protective material is a material that forms oligomers (e.g., dimer, trimer, etc.) or polymers as monomer molecules are deposited on the outermost OED component layer. In some preferred embodiments, the protective material is at least partially transparent to UV radiation.

The protective material may be deposited by any method that provides a protective layer without significantly damaging the uppermost layer of the OED. Such damage can be determined by a corresponding decrease in device performance or lifetime. Preferred methods of deposition of the protective material include physical vapor deposition (i.e., thermal evaporation) under vacuum.

For example, parylene is a suitable protective material. Parylene thin films are generated by thermal evaporation from parylene dimer. When heated to approximately 650° C., the crystalline dimer molecules cleave into monomers and sublime into the gaseous state. When the monomer molecules are deposited on the substrate and/or outermost OED layer at room temperature, they form highly crystalline linear polymer. Several parylene derivatives, such as parylene-C, parylene-D, and parylene-N, with different properties have been developed and are suitable as protective materials.

Since parylene contains phenyl groups, it can serve as an effective UV irradiation barrier. Although reactive ion species generated in a sputtering or CVD process may initially result in some chemical degradations to the parylene polymer, further degradation of the parylene layer will be prevented as the new barrier layer (such as an $Al_2O_3$ layer) is formed. Therefore, if the thickness of the parylene layer is sufficient to withstand the initial attack by the sputter or CVD process, it can serve as an effective protective layer for the LEP material. In addition, parylene is relatively inexpensive and transparent to visible light.

Polyimides are another material suitable for the protective material and for forming a protective layer. Polyimides are normally derived from imidization reactions between diamines and organic acids or organic anhydrides. The reactions form polymer precursors (sometimes referred to as "poly(amic acid)") that are subsequently converted into polyimides. Conversion to polyimides may occur even without the application of heat. Polyimides can be applied, for example, by spin-coating a polyimide solution onto the OED. In preferred embodiments, however, vapor phase polymerization or vapor phase deposition is used to deposit the protective polyimide layer. In some embodiments, preparation of the polyimide protective layer includes a post-deposition baking step at a temperature and for a time sufficient to allow for curing of the polyimide layer.

The thickness of the protective layer should be sufficient to protect the OED component layers from the deposition of the encapsulation layers. In some embodiments, the protective layer will have a thickness of between about 100 nm to about 10 µm, or between about 500 nm and about 3 µm. Quantification of device performance and lifespan is one convenient method for determining appropriate thicknesses of the various layers, including the protective layer, as well as for determining whether a protective layer is necessary/beneficial to the device.

It will be appreciated that the protective layer is optional, and that many of the devices described herein may not require protective layers in order to achieve acceptable device performance. For example, when the uppermost OED layer is a metal electrode, but an encapsulation portion is still desired, the device may not require a protective layer prior to deposition of the encapsulation layers. As described previously, determining whether a protective layer is necessary or desired can be accomplished, for example, by quantifying device performance and device lifespan.

Where the barrier and bonding layers are used as a dielectric layer, it may be necessary in some embodiments to deposit a protective layer prior to deposition of the first barrier layer. For example, where an organic material is used as the bottom electrode, a protective layer can help to maintain the integrity of the electrode layer as the first barrier layer is deposited. Again, it will be appreciated that some embodiments of OEDs according to the invention do not require a protective layer.

The OEDs described herein may further comprise patterned component layers, such as patterned electrodes and dielectric layers. It is also within the scope of the invention to pattern the protective, barrier, and bonding layers when used as encapsulation portions and/or dielectric layers. For example, the protective layer may be patterned to match the patterning of the uppermost OED layer. Patterning of the encapsulation layers can be accomplished using the standard methods (e.g., masking, etching, etc.). In some embodiments, though, the encapsulation portion is not patterned.

Accordingly, herein is described an electroluminescent device (ELD) comprising: a substrate; a first electrode layer disposed on the substrate; an optional intermediate layer that, when present, is covalently attached to the first electrode layer and comprises a silicon-containing, adhesive, crosslinkable portion and an electron-accepting moiety; a dielectric layer disposed on the first electrode layer or on the intermediate layer, when present; a second electrode layer disposed on the dielectric layer; an electroluminescent layer disposed on the second electrode layer; an optional protective layer disposed on the electroluminescent layer; and an encapsulating layer comprising one or more pairs of layers of a barrier material and a cross-linked material.

Furthermore, herein is described a method for protecting a layered electrical device, the method comprising: (a) depositing over the layered electrical device at least one layer of a ceramic barrier material and at least one layer of a cross-linkable material, wherein the cross-linkable material comprises a silicon-containing material; and (b) curing the cross-linkable material.

The methods and devices disclosed herein have one or more advantages over those previously known. Such advantages include, for example, increased durability and longer device life. Unlike encapsulation methods using glass, the encapsulation methods disclosed herein allow for the preparation of flexible encapsulation portions, thereby allowing the preparation of flexible yet durable OEDs. The methods disclosed herein further allow for the preparation of high quality encapsulation portions using a variety of materials. In some embodiments, the encapsulation method of the invention use ceramic barrier layers that are functionalized to react with, and bond to, siloxane bonding materials. The reaction between the functional groups on the barrier layers (e.g., hydroxyl groups) are the siloxane bonding material is energetically favorable, rapid, and efficient in providing stable and effective encapsulation portions.

All patents, patent applications, and publications mentioned herein are hereby incorporated by reference in their entireties. However, where a patent, patent application, or publication containing express definitions is incorporated by reference, those express definitions should be understood to apply to the incorporated patent, patent application, or publication in which they are found, and not to the remainder of the text of this application, in particular the claims of this application.

It is to be understood that while the invention has been described in conjunction with the preferred specific embodiments thereof, that the foregoing description as well as the examples that follow, are intended to illustrate and not limit the scope of the invention. It will be understood by those skilled in the art that various changes may be made and equivalents may be substituted without departing from the scope of the invention, and further that other aspects, advantages and modifications will be apparent to those skilled in the art to which the invention pertains.

EXAMPLES

General Process

On a substrate, such as a conductive metal layer, is sputter deposited 10 nm of oxide barrier material, such as $Al_2O_3$. The substrate is then submerged into a solution containing the preceramic polymer (e.g., PHMS-OH) and sonicated for approximately 1 minute. The substrate is then removed from the preceramic polymer solution and rinsed with a solvent such as ethanol or isopropanol to remove the excess preceramic polymer that is not covalently reacted to the substrate surface; the substrate is then subsequently dried and cured at 120° C. for approximately 30 min. An additional dielectric layer (e.g., $Si_3N_4$) is subsequently deposited via chemical vapor deposition (CVD).

Example 1

The quality of a dielectric layer prepared using the general procedure described above was evaluated by the yield of devices having electrical breakdown voltage>20V.

The following table lists the yield and the total thickness of the dielectric layer of a traditional process ("Control Process") and the process described herein ("Test Process"). The devices produced with the process described herein have significant better quality: a thinner total dielectric layer thickness (117.9 nm) achieved higher yield (91.3%).

TABLE 1

| | Yield of devices having breakdown voltage >20 V | | | | |
|---|---|---|---|---|---|
| | $Al_2O_3$(nm) | PHMS-OH | Nitride thickness (nm) | Total dielectric layer thickness (nm) | Yield (%) |
| Control Process | 10 | none | 145.0 | 155.0 | 82.6 |
| Test Process | 10 | monolayer | 107.9 | 117.9 | 91.3 |

The above process can use any combinations of PVD (physical vapor deposition) or CVD deposited metal oxides (such as $Al_2O_3$, $HfO_2$), metal nitrides, $SiO_2$, and $Si_3N_4$ to generate an ultra-thin dielectric layer possessing high electrical strength.

What is claimed is:

1. A method for forming a dielectric layer in an electronic device comprising:
   (i) forming a barrier layer by depositing a barrier material directly or indirectly on a substrate, wherein the barrier material is a ceramic material;
   (ii) oxidizing the barrier layer to provide exposed functional groups;
   (iii) forming a bonding layer by depositing a layer of a bonding material on the barrier layer, wherein the bonding material is a silicon-containing material and comprises functional groups capable of reacting with the functional groups of the barrier layer,
   wherein the silicon containing material is a siloxane or polysiloxane comprising monomer units having the structure of formula (I)

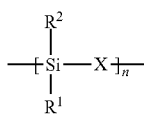

(I)

wherein:
   $R^1$ and $R^2$ are independently selected from H, OH, $C_1$-$C_{30}$ hydrocarbyl, organometallic, halocarbyl, and organosilyl, each of which may be optionally substituted and optionally heteroatom containing;
   X is selected from —O—, and —$NR^3$—;
   $R^3$ is hydrocarbyl; and
   n is an integer greater than or equal to 1.

2. The method of claim 1, wherein the barrier material is a ceramic material selected from one of a group consisting of oxides of aluminum, silicon, titanium, tungsten, magnesium, zirconium, or calcium, nitrides of silicon, tungsten, aluminum, zirconium, chromium, titanium, tantalum, molybdenum, gallium, or boron, carbides of silicon, titanium, vanadium, zirconium, iron, or boron, borides of titanium or iron, and silicides of tungsten and titanium.

3. The method of claim 1, wherein (i), (ii), and (iii) are repeated an additional one to ten times, such that from one to ten additional barrier and bonding layers are formed.

4. The method of claim 1, further comprising curing at elevated temperature.

5. The method of claim 3, further comprising curing after the formation of each bonding layer.

6. The method of claim 3, further comprising curing after all bonding layers are formed.

7. The method of claim 1, wherein the electronic device is selected from an OLED, an organic thin-film transistor, and an organic photovoltaic device.

8. The method of claim 3, wherein each bonding layer has a thickness in the range of about 1 nm to about 100 nm.

9. The method of claim 3, wherein each barrier layer has a thickness in the range of about 5 nm to about 100 nm.

10. The method of claim 3, wherein the barrier and bonding layers have a total thickness of 6 nm-2000 nm.

11. The method of claim 1, wherein the barrier layer is deposited on a bottom electrode.

12. The method of claim 11, wherein the bottom electrode is a layer of a conductive material disposed on a substrate, or wherein the bottom electrode is a conductive substrate.

13. A method for forming a dielectric layer in an electronic device comprising: combining a plurality of component layers disposed on a substrate with a dielectric layer comprising at least a first pair of layers of a barrier material and a cross-linked material, wherein the barrier material is a ceramic material and the cross-linked material is a silicon-containing polymer, wherein the silicon-containing polymer comprises cross-linked units having the structure —[Si($R^2$)(X)$_{1.5}$]—, wherein:
   $R^2$ is selected from H, hydroxyl, fluorocarbyl, and hydrocarbyl;
   X is selected from —O— and —$NR^3$—; and
   $R^3$ is selected from alkyl and aryl.

14. The method of claim 13, wherein the dielectric layer further comprises an additional one to 10 pairs of alternating layers of the barrier material and the cross-linked material.

15. The method of claim 13, wherein the barrier material is a ceramic material selected from oxides of aluminum, silicon, titanium, tungsten, magnesium, zirconium, or calcium, nitrides of silicon, tungsten, aluminum, zirconium, chromium, titanium, tantalum, molybdenum, gallium, or boron, carbides of silicon, titanium, vanadium, zirconium, iron, or boron, borides of titanium or iron, and silicides of tungsten and titanium.

16. The method of claim 13, wherein X is —O— and $R^2$ is selected from alkyl, alkenyl, alkynyl, alkoxy, aryl, aryloxy, aralkyl, and alkaryl, any of which may be heteroatom containing, and any of which may be unsubstituted or substituted with one or more groups selected from halo, hydroxyl, alkyl, and aryl.

17. The method of claim 13, wherein the electronic device comprises a bottom electrode, and wherein the barrier material of the first pair of layers directly contacts the bottom electrode.

18. The method of claim 13, wherein the electronic device is selected from an OLED, an organic thin-film transistor, and an organic photovoltaic device.

19. The method of claim 13, wherein the barrier material of the first pair of layers is attached through covalent linkages to the cross-linked material of the first pair of layers.

20. The method of claim 14, wherein the barrier material of each barrier layer is covalently attached to the cross-linked material of any adjacent barrier layer.

21. The method of claim 13, wherein the dielectric layer has a total thickness of 6 nm-2000 nm.

22. The method of claim 1, further comprising oxidizing the bonding layer to provide exposed functional groups.

23. The method of claim 1, further comprising forming one or more pairs of additional barrier and bonding layers by repeating (i), (ii) and (iii).

* * * * *